(12) United States Patent
Yamada

(10) Patent No.: US 9,144,169 B2
(45) Date of Patent: Sep. 22, 2015

(54) MONITOR MANIPULATOR

(71) Applicant: Honda Motor Co., Ltd., Tokyo (JP)

(72) Inventor: Hajime Yamada, Rancho Palos Verdes, CA (US)

(73) Assignee: HONDA MOTOR CO., LTD., Tokyo (JP)

(*) Notice: Subject to any disclaimer, the term of this patent is extended or adjusted under 35 U.S.C. 154(b) by 359 days.

(21) Appl. No.: 13/888,486

(22) Filed: May 7, 2013

(65) Prior Publication Data

US 2014/0334075 A1 Nov. 13, 2014

(51) Int. Cl.
*H04N 5/64* (2006.01)
*H05K 7/02* (2006.01)
*B60K 37/02* (2006.01)
*H05K 5/00* (2006.01)

(52) U.S. Cl.
CPC *H05K 7/02* (2013.01); *B60K 37/02* (2013.01); *H05K 5/0017* (2013.01); *Y10T 74/20396* (2015.01)

(58) Field of Classification Search
CPC ........................................ H04N 5/64
USPC ........................................ 348/836, 837, 148
See application file for complete search history.

(56) References Cited

U.S. PATENT DOCUMENTS

| | | | |
|---|---|---|---|
| 5,331,413 A * | 7/1994 | Diner | 348/159 |
| 6,409,242 B1 | 6/2002 | Chang | |
| 7,296,774 B2 * | 11/2007 | Oh | 248/324 |
| 7,379,125 B2 | 5/2008 | Chang | |
| 7,894,003 B2 | 2/2011 | Chang | |
| 7,975,350 B2 | 7/2011 | Nagami | |
| 8,229,603 B2 * | 7/2012 | Miyata et al. | 701/1 |
| 8,626,434 B1 * | 1/2014 | Kornmann et al. | 701/400 |
| 2002/0003571 A1 * | 1/2002 | Schofield et al. | 348/148 |
| 2004/0095369 A1 * | 5/2004 | Takeuchi et al. | 345/701 |
| 2007/0095633 A1 * | 5/2007 | Sakai | 200/1 R |
| 2008/0106859 A1 * | 5/2008 | Eguchi et al. | 361/681 |
| 2009/0058845 A1 * | 3/2009 | Fukuda et al. | 345/214 |
| 2009/0150160 A1 * | 6/2009 | Mozer | 704/275 |
| 2009/0295717 A1 * | 12/2009 | Miyako | 345/157 |
| 2010/0073291 A1 * | 3/2010 | Hisatsugu et al. | 345/161 |
| 2011/0164388 A1 * | 7/2011 | Ozaki | 361/725 |
| 2013/0147847 A1 * | 6/2013 | Koseki et al. | 345/660 |
| 2013/0320171 A1 * | 12/2013 | Mccafferty et al. | 248/291.1 |

* cited by examiner

*Primary Examiner* — Paulos M Natnael
(74) *Attorney, Agent, or Firm* — Pearne & Gordon LLP

(57) ABSTRACT

A system includes a display, a manually operable controller and a mechanism. The display includes a screen, a first axis and a second axis disposed within a plane that is parallel and adjacent the screen. The second axis is perpendicular to the first axis. The controller can be tilted around a first controller axis and around a second controller axis and is configured as an elongate beam longitudinally disposed parallel to the first controller axis at a default position. The second controller axis is perpendicular about the first controller axis. The mechanism operatively couples the controller to the display such that the screen is configured to rotate around the first axis in response to the controller being tilted around the first controller axis and the screen is configured to rotate around the second axis in response to the controller being tilted around the second controller axis.

8 Claims, 5 Drawing Sheets

MONITOR MANIPULATOR

TECHNICAL FIELD

The present disclosure relates to apparatuses and methods of controlling a display and, more particularly, apparatuses and methods of altering an orientation of a screen on a display.

BACKGROUND

Display devices generally tend to have a viewing angle that limits where a viewer can be located to experience acceptable visual performance. While some display devices are equipped with a screen that is large enough to enable multiple viewers who are spaced apart by wide intervals to experience acceptable visual performance, display devices with a small-sized screen may need to be used in an environment that is spatially restricted. In such situations, the viewers outside the viewing angle or near the limits of the viewing angle may have trouble seeing what is being displayed. In such a situation, it may be helpful to provide a screen the orientation of which can be adjusted to provide a better view to one of the viewers. Moreover, it may be helpful if the orientation of the screen can be adjusted from a distance, for example, without touching the screen.

Therefore, there is a need for apparatuses and methods that allows a screen of a display device to be adjusted.

SUMMARY

In a first example, a system includes a display, a manually operable controller and a mechanism. The display includes a screen, a first axis and a second axis disposed within a plane that is parallel and adjacent the screen. The second axis is perpendicular to the first axis and the screen is rotatable around the first axis and around the second axis. The controller can be tilted around a first controller axis and around a second controller axis and is configured as an elongate beam longitudinally disposed parallel to the first controller axis at a default position. The second controller axis is perpendicular about the first controller axis. The mechanism operatively couples the controller to the display such that the screen is configured to rotate around the first axis in response to the controller being tilted around the first controller axis and the screen is configured to rotate around the second axis in response to the controller being tilted around the second controller axis. The plane is configured to be disposed parallel to the screen throughout the rotation of the screen. The first axis and the second axis are configured to remain disposed within the plane throughout the rotation of the screen.

In one example aspect of the first example, the controller is disposed such that the first controller axis is substantially parallel to the first axis at an initial position of the screen.

In another example aspect of the first example, the first axis and the first controller axis are substantially horizontal. The second axis is substantially upright and the second controller axis is substantially vertical.

In yet another example aspect of the first example, a screen rotational direction is substantially similar to a controller tilt direction in that the screen is configured to rotate away from a viewer around the first axis in response to the controller being tilted in a fore direction around the first controller axis, the screen is configured to rotate toward a viewer around the first axis in response to the controller being tiled in an aft direction around the first controller axis, the screen is configured to rotate in a clockwise direction around the second axis in response to the controller being tilted in a clockwise direction around the second controller axis and the screen is configured to rotate in a counterclockwise direction around the second axis in response to the controller being tilted in a counterclockwise direction around the second controller axis.

In yet another example aspect of the first example, the controller is biased to return to a default position after being tilted, and the screen is configured to maintain a position altered from an initial position through rotation.

In yet another example aspect of the first example, the screen is a rectangle including a top edge, a bottom edge, a left edge and a right edge.

In yet another example aspect of the first example, the first axis is located below and parallel to the bottom edge.

In yet another example aspect of the first example, the second axis is parallel to a line through a midpoint of the top edge and a midpoint of the bottom edge.

In yet another example aspect of the first example, the display is part of a head-up display unit.

In yet another example aspect of the first example, the system is provided in a vehicle with a first seat and a second seat. The system is accessible from the first and second seats. The system provides a set of controls configured to orient the screen for viewing from any of the first seat and the second seat.

In yet another example aspect of the first example, the screen is concealed when the system is turned off.

In a second example, a manually operable controller includes a base portion and an elongate grasped portion. An elongate grasped portion is mounted on the base portion and is movable relative to the base portion. The controller includes a first controller axis around which the grasped portion can be rotated and a second controller axis around which the grasped portion can be rotated. The controller is longitudinally disposed parallel to the first controller axis at a default position. The second controller axis is perpendicular about the first controller axis. The grasped portion is configured to be tilted around the first controller axis and around the second controller axis. The grasped portion is biased to return to a default position after being tilted.

In one example aspect of the second example, the first controller axis is substantially horizontal and the second controller axis is substantially vertical.

In another example aspect of the second example, the grasped portion can be tilted in a fore direction around the first controller axis. The grasped portion can be tilted in an aft direction around the first controller axis. The grasped portion can be tilted in a clockwise direction around the second controller axis. The grasped portion can be tilted in a counterclockwise direction around the second controller axis.

In a third example, a method of operating a system is provided. The system includes a display including a screen. A first axis and a second axis are disposed within a plane. The second axis is perpendicular to the first axis. The screen is rotatable around the first axis and around the second axis. The plane is configured to move and maintain a parallel orientation relative to the screen during rotation of the screen. The first axis and the second axis are configured to remain disposed within the plane throughout the rotation of the screen. The screen is shaped as a rectangle including a top edge, a bottom edge, a left edge and a right edge. The method includes a step of disposing the first axis below and parallel to one of the top edge and the bottom edge. The method further includes a step of disposing the second axis to be parallel to a line through a midpoint of the top edge and a midpoint of the bottom edge. The method further includes a step of providing a manually operable controller which is located at a distance from the screen. The controller is configured to be tilted around a first controller axis and around a second controller axis that is perpendicular about the first controller axis. The controller is configured as an elongate beam longitudinally parallel to the first controller axis at a default position of the controller. The method further includes a step of altering an orientation of the screen with the controller through rotation around the first axis and around the second axis.

In one example aspect of the third example, the method further includes a step of disposing the controller such that the first controller axis is substantially parallel with the first axis at an initial position of the screen.

In another example of the third example, the step of altering involves tilting the controller around the first controller axis to rotate the screen around the first axis or tilting the controller around the second controller axis to rotate the screen around the second axis.

In yet another example of the third example, the method further includes steps of configuring the controller to be biased toward the default position and configuring the screen to maintain a position altered from an initial position through rotation.

In yet another example of the third example, the system is provided in a vehicle with a first seat and a second seat. The system is accessible from the first seat and the second seat. The method further includes a step of orienting the screen for viewing from one of the first seat and the second seat.

In yet another example, the first controller axis and the first axis are substantially horizontal. The second axis is substantially upright and the second controller axis is substantially vertical.

BRIEF DESCRIPTION OF THE DRAWINGS

These and other aspects are better understood when the following detailed description is read with reference to the accompanying drawings, in which:

FIG. 3 is a view of the screen and the controller where the display system is turned on;

DETAILED DESCRIPTION

Figure 1:
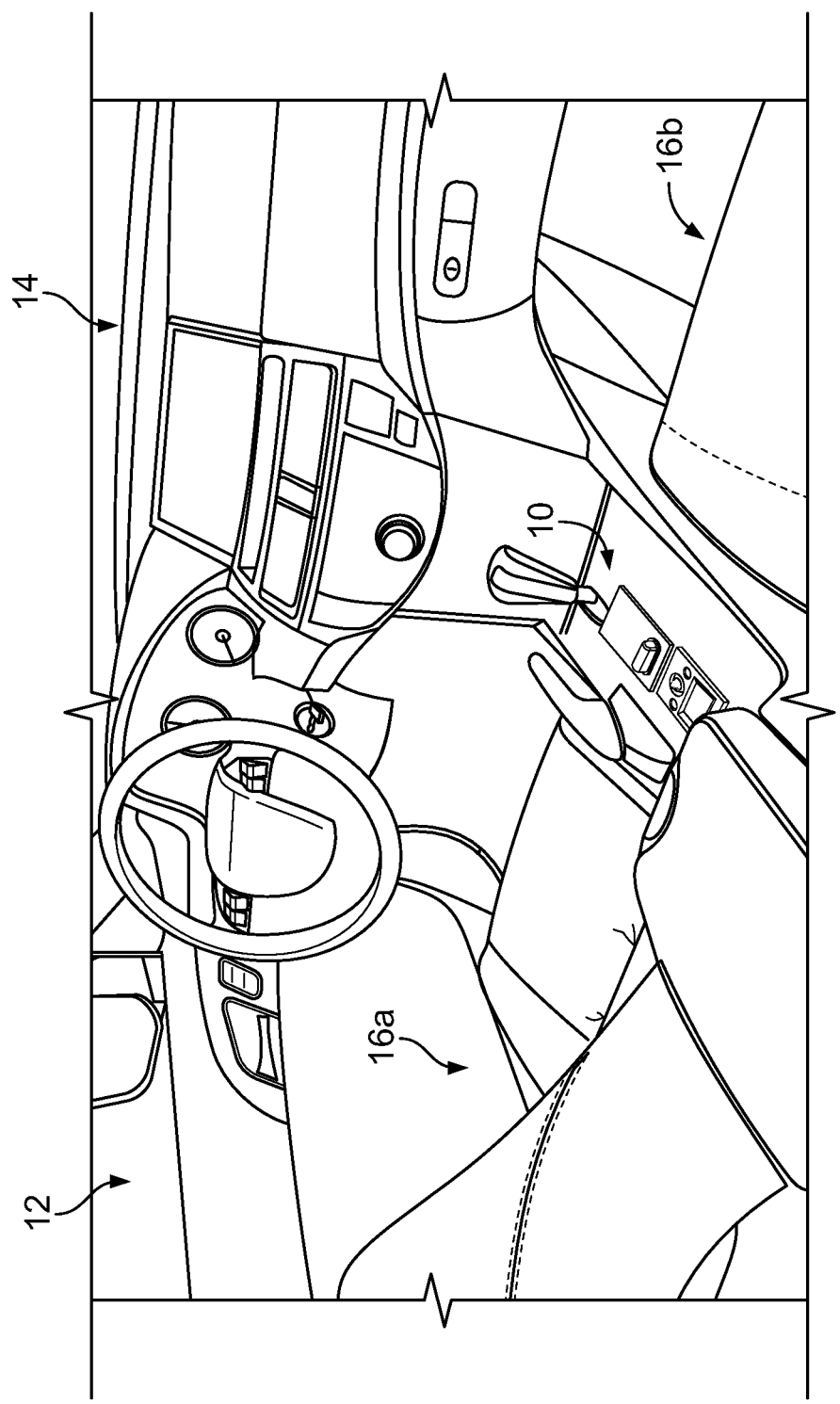
FIG. 1 is a view of an example setting in which a display system discussed herein may be installed.

Examples will now be described more fully hereinafter with reference to the accompanying drawings in which example embodiments are shown. Whenever possible, the same reference numerals are used throughout the drawings to refer to the same or like parts. However, aspects may be embodied in many different forms and should not be construed as limited to the embodiments set forth herein.

FIG. 1 shows an example setting in which an example embodiment of a display system 10 discussed herein may be installed. Specifically, FIG. 1 shows an example embodiment of the interior of an automobile although the display system 10 may be installed inside other types of vehicles (e.g., a bus, a truck, an aircraft, a ship, a boat, a train or the like) or a stationary structure (e.g., a trailer, a mobile home, a building or the like). In the present embodiment, the setting is inside a passenger compartment 12 of an automobile, and a dashboard 14, a driver seat 16a and a passenger seat 16b are provided in the passenger compartment 12 as shown in FIG. 1.

The term "display system" should be construed to encompass a variety of electronic or electrical devices with a screen that can convey visually perceptible information (e.g., images, photos, graphics, videos, light or the like). The screen may convey visual information by way of various types of technology such as liquid crystal display (LCD), organic light emitting diode (OLED), light emitting diode (LED), cathode ray tube (CRT), or the like. Additionally, the display system 10 may be of a multimedia type that can also convey information in additional media such as sound, music, etc. and thus may include features such as speakers.

Figure 2:
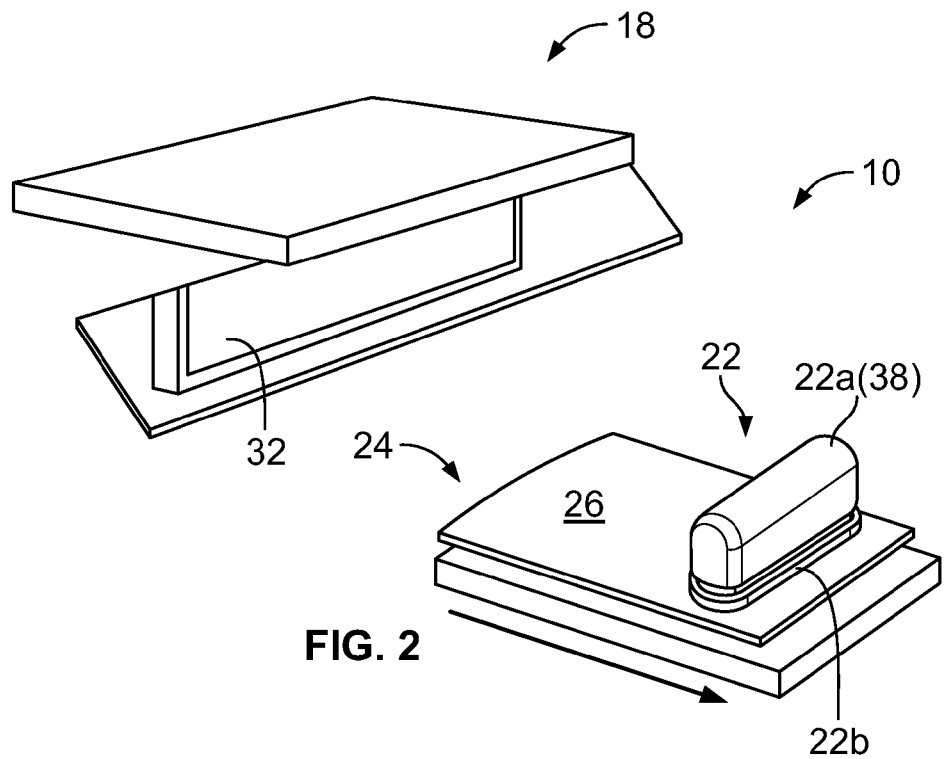
FIG. 2 is a view of an example embodiment of the display system including a screen and a controller where the display system is turned off.
Figure 3:
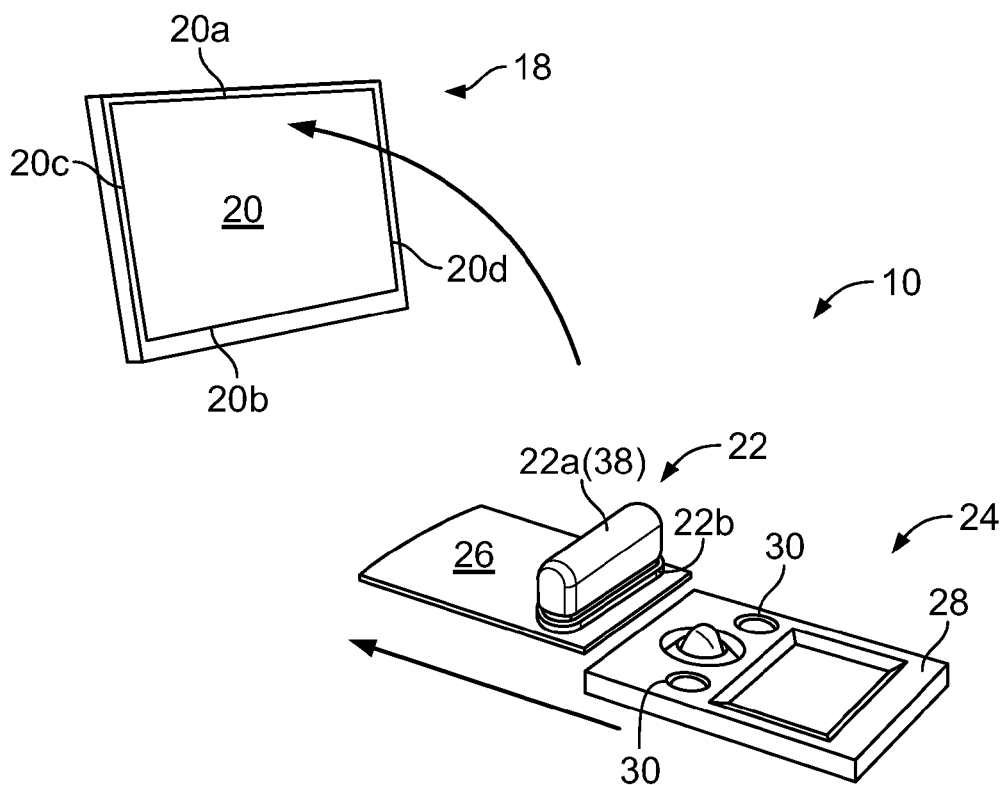

The system 10 may be configured to display images or videos to a plurality of viewers seated at multiple locations in proximity with the system 10. For example in the case of an automobile, the viewers may include a driver and a front passenger, and one or more rear passengers, and the system 10 may be accessible by any of the viewers and may be manipulated by any of them. As shown in FIGS. 2-3, the system 10 may include a display 18 with a screen 20 and further include a controller 22 configured to allow adjustment of an orientation of the screen 20. The display system 10 may provide information relating to a navigation system, an entertainment system for music, video, gaming, or the like, an air conditioning system for heating or cooling, or a control system to adjust the operational settings of the vehicle or a structure in which the system 10 is provided. The display 18 may be part of a head-up display (HUD) unit provided as part of the dashboard 14.

The controller 22 may be provided at a distance from the screen 20 at a location that is accessible by all of the viewers and, for example, may be provided on a control area 24 located on a console/storage area between the driver seat 16a and the passenger seat 16b. The controller 22 may be located on a movable component and, for example, may be mounted on a slidable cover 26 that may be used to conceal a user interface 28 to hide the user interface 28 from view when the system 10 is not in use. The user interface 28 may provide additional features to control the system 10 and, as shown in FIG. 3, may include a number of buttons 30, a secondary screen 32 (FIG. 2), and other features that allow interaction with the system 10 such as a touchpad, a control dial, a scroll wheel, a trackball or the like. Additionally, the display 18 may include sensors behind the screen 20 to allow a user to interact with the display system 10 by touching the screen 20. In an alternative embodiment, the controller 22 may be mounted on a stationary component unlike the slidable cover 26.

The features on the control area 24 including the controller 22 and the user interface 28 are operatively connected to the display system 10 so as to control and interact with the display system 10. There may be a variety of ways in which one or more features in the control area 24 and the display system 10 are operatively connected and, for example, the connection may be electronic, electrical, wireless, etc.

When the display system 10 is turned off and is not being used, the display 18 may be rotated or oriented to conceal the screen 20 (FIG. 2). When the display system 10 is turned on for use, the display 18 may be oriented to assume an initial position in which the screen 20 is substantially upright (FIG. 3). The term "upright" may describe a vertical position and a substantially vertical position and the term "substantially upright" may describe positions in which the screen 20 is at an acute angle with respect to a vertical orientation as shown in phantom in FIG. 5.

Figure 4:
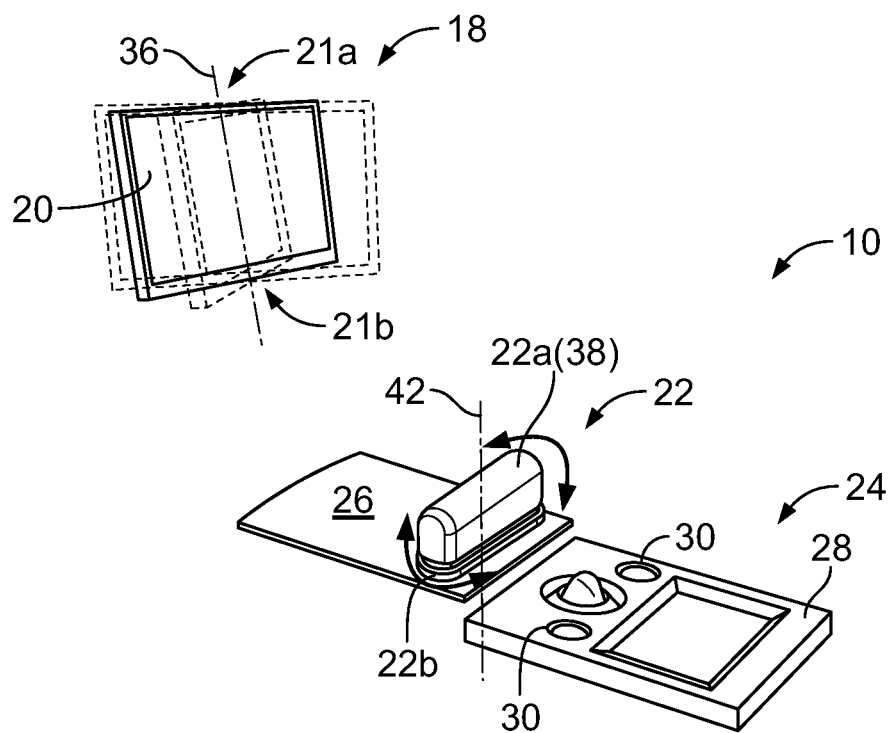
FIG. 4 is a view of the screen which rotates around a second axis in response to the tilting of the controller around a second controller axis.
Figure 5:
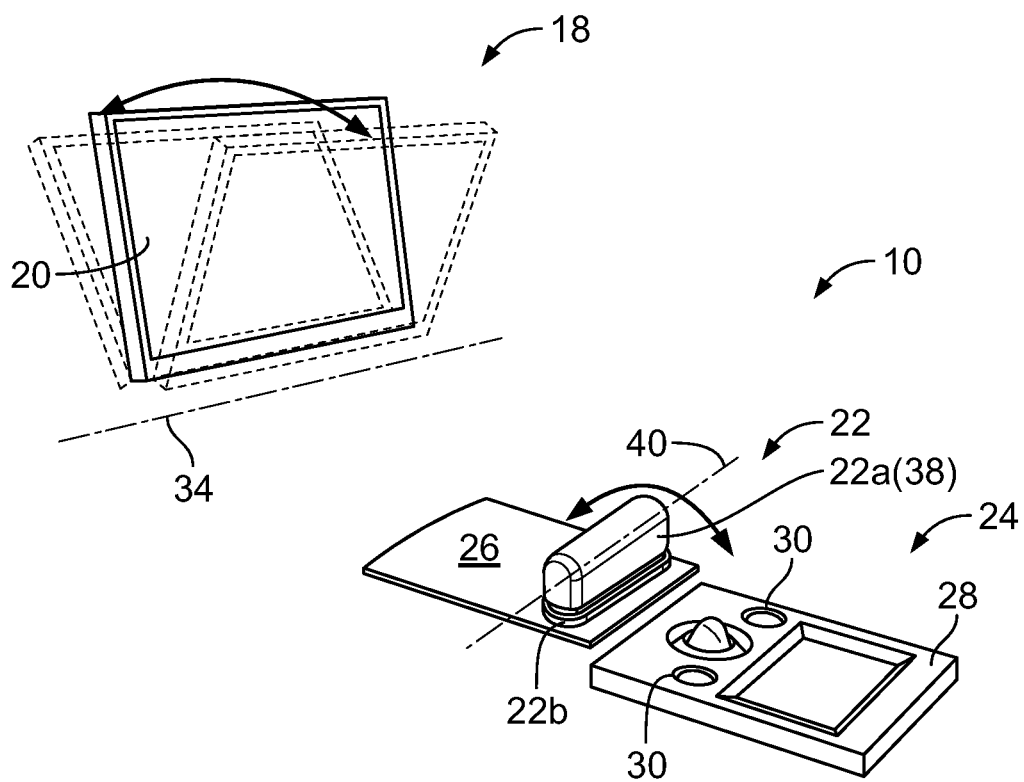
FIG. 5 is a view of the screen which rotates around a first axis in response to the tilting of the controller around a first controller axis.
Figure 6:
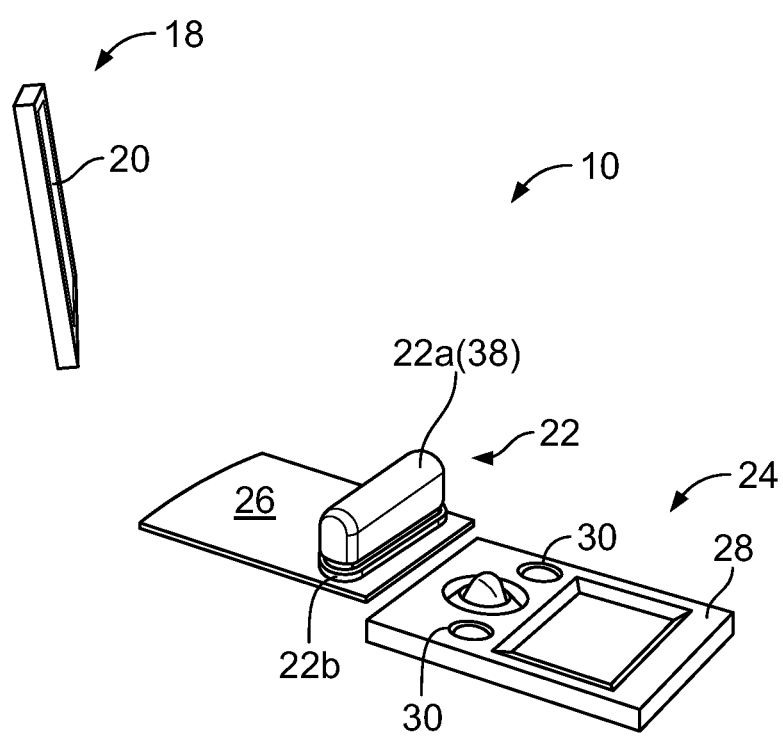
FIG. 6 is a view of the display system including a set of controls which orients the screen for viewing from a predetermined location.

The screen 20 may be flat or substantially flat. The orientation of the screen 20 may be configured to be adjustable such that the screen 20 can be adjusted to face the location of the viewer. The screen 20 may be configured to be rotatable around a first axis 34 (FIG. 5) and a second axis 36 (FIG. 4). Both axes 34, 36 may be disposed within a plane and the axes 34, 36 may be perpendicular to one another. The screen 20 may be parallel to and adjacent the plane in which the axes 34, 36 lie or, alternatively, the screen 20 may lie within the plane in case the screen 20 is flat. As shown in FIG. 3, the screen 20 may be a rectangle with a top edge 20a, a bottom edge 20b, a left edge 20c and a right edge 20d. The first axis 34 may be parallel to the lengthwise edges 20a and 20b while the second axis 36 may be parallel to the widthwise edges 20c and 20d. Moreover, the first axis 34 may be outside the screen 20 and, for example, the first axis 34 may be located at a distance from and parallel to one of the top edge 20a or the bottom edge 20b. In FIG. 5, the first axis 34 is below and parallel to the bottom edge 20b. Under such a configuration of the first axis 34, the first axis 34 is substantially horizontal and the screen 20 can be rotated vertically in forward or backward directions as shown in FIG. 5. Moreover, the second axis 36 may be substantially parallel to a line extending through a midpoint 21a of the top edge 20a and a midpoint 21b of the bottom edge 20b as shown in FIG. 4. Under such a configuration of the second axis 36, the second axis 36 may be vertical or substantially vertical and the screen 20 can be rotated substantially horizontally around the second axis 36 as shown in FIG. 4. As the orientation of the screen 20 is altered through rotation around the first axis 34 and the second axis 36, the first axis 34 and the second axis 36 remain disposed within the plane of the screen 20 as the plane maintains a parallel orientation about the screen 20. Thus, the first axis 34 and the second axis 36 remain disposed within the plane throughout rotation of the screen 20 and such a plane remains parallel to the screen 20 throughout rotation of the screen 20.

The term "substantially parallel" is meant to include not only orientations in which two axes or lines are parallel but also orientations in which one of the axes or lines is misaligned by a few degrees. The terms "substantially vertical" or "substantially horizontal" are meant to include not only vertical or horizontal orientations but also orientations in which an axis or line is misaligned by a few degrees.

The controller 22 may include a grasped portion 22a and a base portion 22b to which the grasped portion 22a is movably connected. The base portion 22b may be a column-like feature with a cross-section that is circular, oval, polygonal or the like and may be integrated into the movable component (i.e., the slidable cover 26) or a stationary component. While the grasped portion 22a may be embodied in various shapes, the grasped portion 22a of the controller 22 in the present embodiment is shaped as an elongate beam 38. A top portion of the beam 38 may be shaped to be without sharp edges or may be ergonomically shaped so as to gripping with a hand comfortable or easy. Also, the controller 22 may be dimensioned to be small so as to require manipulation with fingers.

Moreover, the controller 22 may be configured to be movable in manners similar to the movements of the screen 20. Specifically, the elongate beam 38 may be oriented such that its longitudinal axis is identical or parallel to a first controller axis 40 (FIG. 5). The grasped portion 22a may thus be configured to be tilted around the first controller axis 40 in fore or aft directions. In response to the fore or aft manipulation of the grasped portion 22a around the first controller axis 40, the screen 20 may rotate backward away from the viewer or forward toward the viewer respectively such that a direction in which the screen 20 rotates (i.e., a screen rotational direction) is the same or substantially similar to a direction in which the controller 22 is tilted (i.e., a controller tilt direction) as shown in FIG. 5. The grasped portion 22a may also be configured to be tilted around a second controller axis 42 (FIG. 4) that is perpendicular to the first controller axis 40. The second controller axis 42 may be vertical such that the grasped portion 22a may be rotated in clockwise or counterclockwise directions around the second controller axis 42 as shown in FIG. 4. The term "substantially similar" as it relates to these directions is meant to indicate that the first controller axis 40 may not be completely parallel with the first axis 34 or the second controller axis 42 may not be completely parallel with the second axis 36 but that the arrangement of these axes is sufficiently close to parallel. Thus, the screen rotational direction of the screen 20 and the controller tilt direction of the controller 22 may be very similar to one another in that the screen rotational direction around the first axis 34 is away from the viewer in response to the controller 22 being tilted in a fore direction around the first controller axis 40, the screen rotational direction around the first axis 34 is toward the viewer in response to the controller 22 being tilted in an aft direction around the first controller axis 40, the screen rotational direction around the second axis 36 is clockwise around the second axis 36, from a top view for example, in response to the controller 22 being tilted in a clockwise direction around the second controller axis 42 and the screen rotational direction around the second axis 36 is counterclockwise around the second axis 36 in response to the controller being tilted in a counterclockwise direction.

In FIGS. 4-5, the controller 22 is disposed such that the first controller axis 40 of the elongate beam 38 is parallel to the first axis 34 at the initial position of the screen 20 (FIG. 3). However, the first controller axis 40 need not be disposed parallel to the first axis 34 at the initial position of the screen. Under the configuration in which the first controller axis 40 is parallel to the first axis 34, tilting the controller 22 around the first controller axis 40 toward or away from the screen 20 (i.e., fore or aft directions) results in the screen 20 rotating backward or forward respectively around the first axis 34 and tilting the controller 22 around the second controller axis 42 clockwise or counterclockwise results in the screen 20 rotating clockwise or counterclockwise respectively around the second axis 36. Thus, the screen 20 will rotate around the first axis 34 or the second axis 36 in the same or substantially similar screen rotational direction as the controller tilt direction of the grasped portion 22a. The first controller axis 40 may be horizontal or substantially horizontal and the second controller axis 42 may be vertical or substantially vertical in the aforementioned configuration.

Moreover, the controller 22 may be configured such that the grasped portion 22a is biased to return to a default position once a user releases the controller 22 after tilting the controller 22 around the first controller axis 40 or around the second controller axis 42. For example, the controller 22 may utilize a combination of a spring and a damping feature to help the controller 22 to return to the default position once manipulation is over. Contrastingly, the screen 20 is configured to maintain a position that starts from the initial position but is reached through rotation around any of the first axis 34 and the second axis 36 although the grasped portion 22a returns to the default position. In an alternative embodiment, the controller 22 may be without the biasing mechanism and may be configured to maintain a position that is reached after rotation around the first axis 34 and/or the second axis 36 similarly to the position of the screen 20 that is altered from the initial position.

After the display system 10 is turned on, the display 18 may assume a predetermined, initial position (FIG. 3) in which the screen 20 is vertical or substantially vertical (e.g., slightly tilted backward) and in which the first axis of the screen 20 is parallel or substantially parallel to the first controller axis 40. The orientation of the screen 20 may be altered from the initial position through rotation around the first axis 34 or the second axis 36 by manipulating the controller 22. Moreover, the control area 24 may be configured with a set of controls configured to orient the screen 20 for viewing from one of the plurality of seats 16a, 16b. For example, a number of buttons 30 may be provided as part of the set of controls and each of the buttons 30 may orient the screen 20 for viewing from the seat 16a or 16b corresponding to the button 30. If the control area 24 is manipulated to turn off the display system 10, the screen 20 may return to the initial position (FIG. 3) before the display 18 assumes the position in which the screen 20 is concealed as shown in FIG. 2.

Figure 7A:
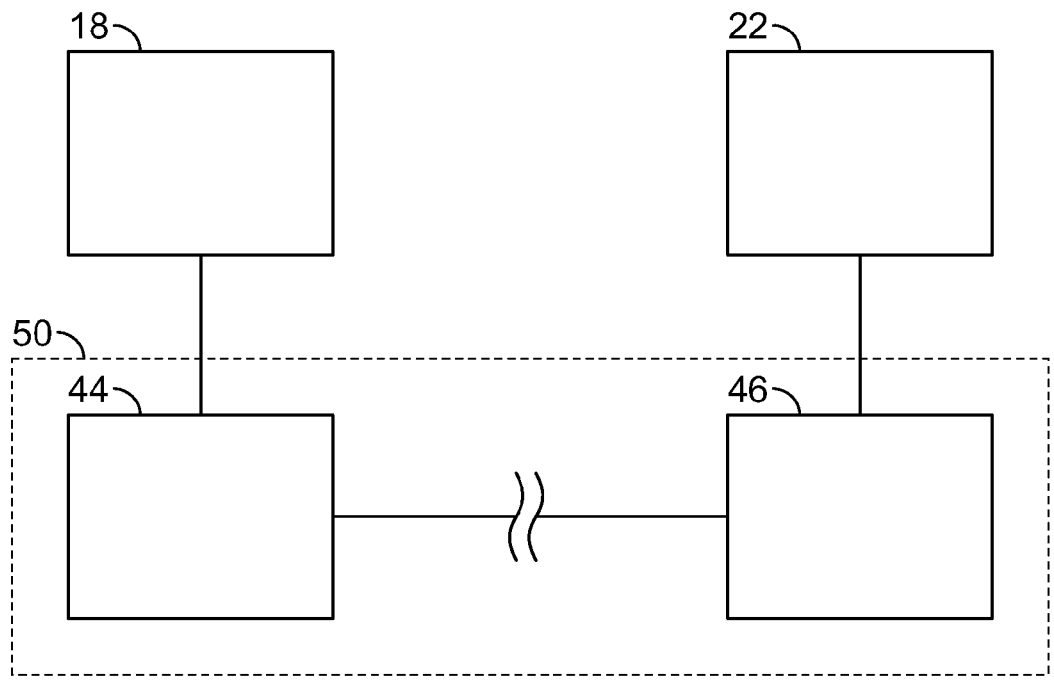
FIG. 7A is a schematic view of a first example embodiment of a control mechanism coupling a display to the controller.
Figure 7B:
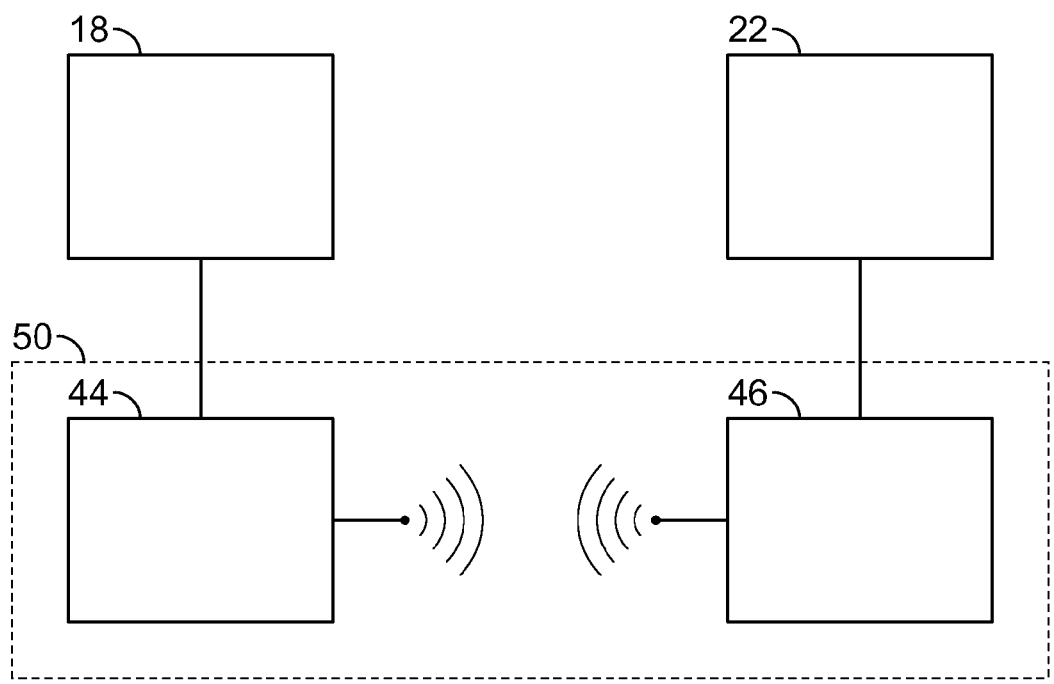
FIG. 7B is a schematic view of a second example embodiment of the control mechanism coupling the display to the controller.

The movements of the screen 20 around the first axis 34 and the second axis 36 may be accomplished by a number of different mechanisms. For example, a first motor may be provided to engage and rotate a first shaft disposed along the first axis while a second motor may be provided to engage and rotate a second shaft disposed along the second axis. The movement of the controller 22 may be correlated with the operation of the first and second motors. For example, the controller 22 may be operatively coupled to relays that actuate the first and second motors depending on the orientation of the controller 22 reached through tilting. The motors may be of a stepper motor type that can assume various discrete positions thereby allowing the display 18 to undergo various degrees of rotations. Moreover, moving the controller 22 in a first controller tilt direction around the first controller axis 40 may rotate the first motor in one screen rotational direction while moving the controller 22 in a second controller tilt direction around the second controller axis 42 may rotate the first motor in an opposite screen rotational direction. Furthermore, moving the controller 22 in a third controller tilt direction around the second controller axis 42 may rotate the second motor in one rotational direction while moving the controller 22 is a fourth controller tilt direction around the second controller axis 42 may rotate the second motor in the opposite screen rotational direction. FIGS. 7A-7B illustrates schematically example embodiments of a control mechanism 50 that operatively couples the display 18 to the controller 22. The control mechanism 50 may include a first control unit 46 that receives an input from the controller 22 and transmits an output that may be transmitted in an electrical, electronic (FIG. 7A), wireless (FIG. 7B) manner or the like to a second control unit 44 that operates the mechanism (e.g., first and second motors) as described above to accomplish the desired alterations to the orientations of the display 18.

The display system 10 may be operated in the following manner. The user may utilize a feature (e.g., a power button) to turn on the display system 10. Alternatively, moving the slidable cover 26 so as to reveal the user interface 28 may turn on the display system 10 and rotate the display 18 backward from a prone position in which the screen 20 is concealed (FIG. 2) to the initial position in which the screen 20 is substantially upright and is not rotated with respect to the second axis 36 (FIG. 3). The user may press a button 30 that corresponds to the seat of the user and the screen 20 may automatically turn to face the user. This rotation is likely to be around the second axis 36. For example, a button 30 may be provided for the front passenger seat 16b to turn the screen 20 toward the front passenger seat 16b so that the driver cannot see the screen 20. Wherever the user is seated, the user can operate the controller 22 around the first and second controller axis 40, 42 to further adjust the orientation of the screen 20 around the first and second axes 34, 36 so as to have a better view of what is displayed on the screen 20. Thereafter, once the user has finished using the display system 10, the user presses the power button or closes the slidable cover 26 to turn off the display system 10 and the screen 20 returns to the initial position by undoing any rotation that occurred through the button 30 and/or the controller 22 and then rotates forward around the first axis 34 to return the prone position.

It will be apparent to those skilled in the art that various modifications and variations can be made without departing from the spirit and scope of the claimed invention.

What is claimed is:

1. A system including:
    a display including a screen, a first axis and a second axis disposed within a plane that is parallel and adjacent the screen, the second axis being perpendicular to the first axis, the screen being rotatable around the first axis and around the second axis;
    a manually operable controller that can be tilted around a first controller axis and around a second controller axis, the controller configured as an elongate beam longitudinally disposed parallel to the first controller axis at a default position, the second controller axis being perpendicular about the first controller axis; and
    a mechanism operatively coupling the controller to the display such that the screen is configured to rotate around the first axis in response to the controller being tilted around the first controller axis, the screen is configured to rotate around the second axis in response to the controller being tilted around the second controller axis, the plane is configured to be disposed parallel to the screen throughout the rotation of the screen, and the first axis and the second axis are configured to remain disposed within the plane throughout the rotation of the screen;
    wherein the controller is disposed such that the first controller axis is substantially parallel to the first axis at an initial position of the screen;
    wherein the first axis and the first controller axis are substantially horizontal, the second axis is substantially upright and the second controller axis is substantially vertical; and
    wherein a screen rotational direction is substantially similar to a controller tilt direction in that the screen is configured to rotate away from a viewer around the first axis in response to the controller being tilted in a fore direction around the first controller axis, the screen is configured to rotate toward a viewer around the first axis in response to the controller being tiled in an aft direction around the first controller axis, the screen is configured to rotate in a clockwise direction around the second axis in response to the controller being tilted in a clockwise direction around the second controller axis and the screen is configured to rotate in a counterclockwise direction around the second axis in response to the controller being tilted in a counterclockwise direction around the second controller axis.

2. The system of claim 1, wherein the controller is biased to return to a default position after being tilted, and the screen is configured to maintain a position altered from an initial position through rotation.

3. The system of claim 1, wherein the screen is a rectangle including a top edge, a bottom edge, a left edge and a right edge.

4. The system of claim 3, wherein the first axis is located below and parallel to the bottom edge.

5. The system of claim 4, wherein the second axis is parallel to a line through a midpoint of the top edge and a midpoint of the bottom edge.

6. The system of claim 1, wherein the display is part of a head-up display unit.

7. The system of claim 1, wherein the system is provided in a vehicle with a first seat and a second seat, the system is accessible from the first and second seats, and the system provides a set of controls configured to orient the screen for viewing from any of the first seat and the second seat.

8. The system of claim 1, wherein the screen is concealed when the system is turned off.

* * * * *